US 6,654,841 B2

(12) United States Patent  
Lin

(10) Patent No.: US 6,654,841 B2  
(45) Date of Patent: Nov. 25, 2003

(54) USB INTERFACE FLASH MEMORY CARD READER WITH A BUILT-IN FLASH MEMORY

(75) Inventor: Tony Lin, Taipei (TW)

(73) Assignee: Power Quotient International Company, Inc., Taipei Hsien (TW)

(*) Notice: Subject to any disclaimer, the term of this patent is extended or adjusted under 35 U.S.C. 154(b) by 283 days.

(21) Appl. No.: 09/904,905

(22) Filed: Jul. 16, 2001

(65) Prior Publication Data

US 2002/0166009 A1 Nov. 7, 2002

(30) Foreign Application Priority Data

May 3, 2001 (TW) .......................................... 90207115

(51) Int. Cl.⁷ .............................................. G06F 13/00
(52) U.S. Cl. ....................... 710/301; 710/313; 710/74; 710/62; 361/684
(58) Field of Search ................................. 361/683–684, 361/752; 439/131; 710/62–64, 72–74, 100, 300–304, 313

(56) References Cited

U.S. PATENT DOCUMENTS

| 6,315,582 | B1 | * | 11/2001 | Nishio et al. ................ 439/131 |
| 6,435,409 | B1 | * | 8/2002 | Hu ............................. 235/441 |
| 6,438,638 | B1 | * | 8/2002 | Jones et al. .................. 710/301 |
| 6,522,552 | B1 | * | 2/2003 | Lee ............................. 361/752 |
| 6,524,137 | B1 | * | 2/2003 | Liu et al. ..................... 439/638 |
| 6,557,754 | B2 | * | 5/2003 | Gray et al. .................. 235/375 |
| 6,563,714 | B2 | * | 5/2003 | Chang ......................... 361/752 |
| 6,567,273 | B1 | * | 5/2003 | Liu et al. ..................... 361/737 |

FOREIGN PATENT DOCUMENTS

| EP | 1 168137 A | * | 1/2002 | ............. G06F/1/00 |
| EP | 1 209574 A | * | 5/2002 | ........... G06F/13/20 |

* cited by examiner

Primary Examiner—Christopher B. Shin  
(74) Attorney, Agent, or Firm—Troxell Law Office PLLC

(57) ABSTRACT

A USB interface flash memory card reader is attached with a built-in flash memory so that the card reader itself provides a function of data storage in addition to a function of reading data in a flash memory card or writing data into the flash memory card.

4 Claims, 3 Drawing Sheets

USB INTERFACE FLASH MEMORY CARD READER WITH A BUILT-IN FLASH MEMORY

BACKGROUND OF THE INVENTION

1. Field of the Invention

The present invention relates to a USB interface flash memory card reader with a built-in flash memory, and particularly, to a USB interface flash memory card reader which is attached with a built-in flash memory to perform data read, write, and delete even if no flash memory card is available.

2. Description of Related Art

It is known that the flash card reader available in the market simply reads or delete data in the flash memory or writes data into the flash memory card.

For the manufacturer, how to make a product in accordance with the operation way the user is used to under a condition of taking advantage of the characteristics of the product is vital subject needed to care in order to increase the additional value of the product and offer the consumer a variety of choices.

SUMMARY OF THE INVENTION

An object of the present invention is to provide a USB interface flash memory card reader with a built-in flash memory, which can execute the data read, write, or delete by way of either inserting a flash memory card or the built-in flash memory to facilitate the data storage.

BRIEF DESCRIPTION OF THE DRAWINGS

The present invention can be more fully understood by reference to the following description and accompanying drawings, in which.

DETAILED DESCRIPTION OF THE PREFERRED EMBODIMENTS

Figure 1:
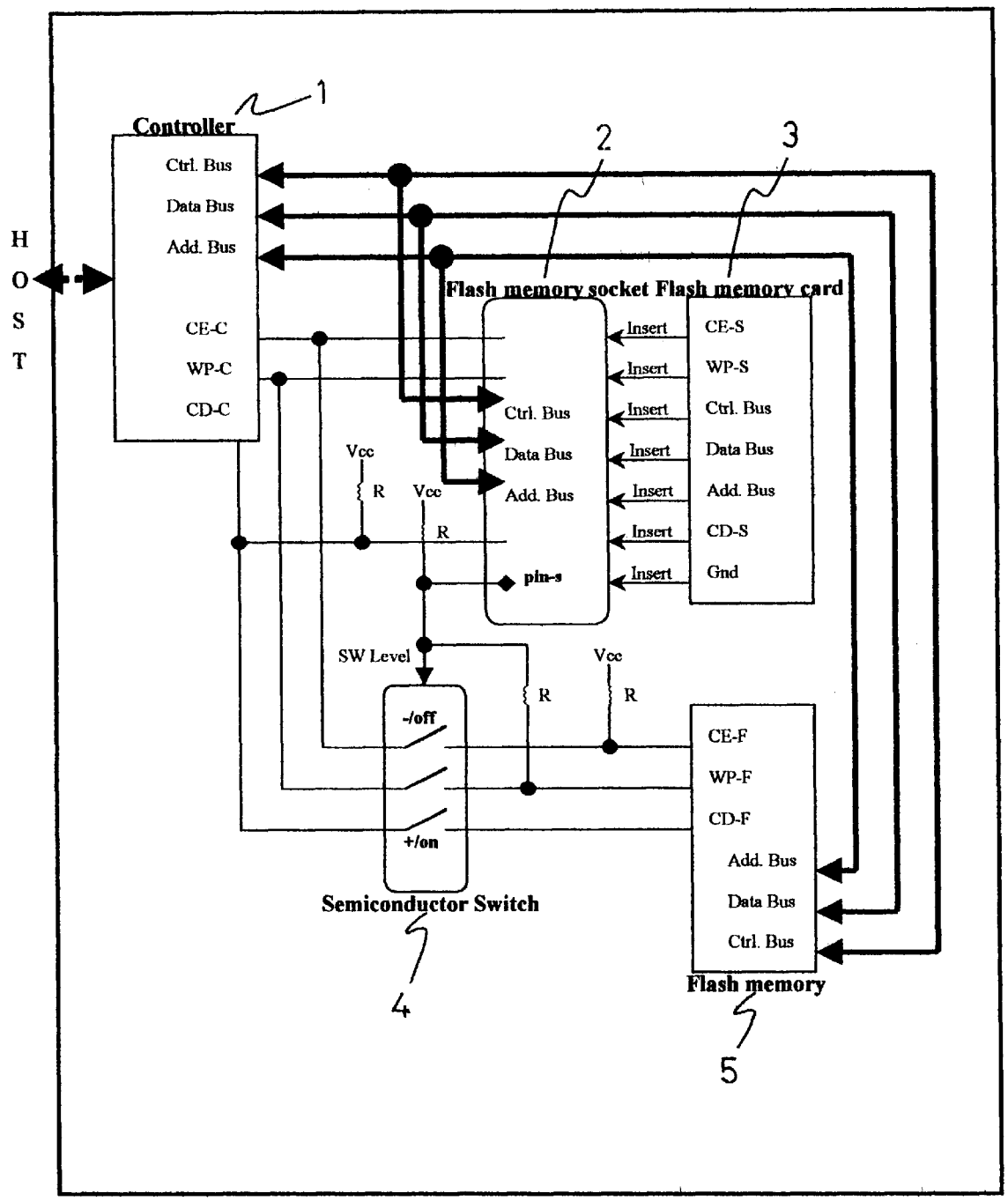
FIG. 1 is a block diagram of circuit in a circuit board in a USB interface card reader with built-in flash memory according to the present invention.

Referring to FIG. 1, a block diagram of the USB interface flash memory card reader with built-in flash memory according to the present invention is illustrated. Wherein, a micro controller 1 decodes commands of the host interface such as data read, data write, or data delete to the commands such as data read, data write, or data delete needed by a flash memory card 3. A socket 2 is for being detachably inserted with the flash memory card 3 such that a signal can be connected as soon as the flash memory card 3 has been inserted in the socket 2 and the signal becomes disconnected as soon as the flash memory card 3 is removed from the socket 2. Once the flash card 3 is in a state of having been in the socket 2, the micro controller 1 can read, or delete the data in the flash memory card 3 or write the data into the flash memory card 3. A semiconductor switch 4 is a switch possible to shift the functions thereof automatically based on different trigger positions. A flash memory 5 is a built-in memory in the USB interface flash memory card reader of the present invention so that the micro controller 1 can read out or write into the flash memory 5 before the flash memory card 3 being inserted into the socket 2.

The application circuit in the USB interface flash card reader with a built-in flash memory is available for the micro controller 1 to select the flash memory card 3 or the built-in flash memory 5 while the data is going to be read or written. In order to simplify the complicate circuit, there are three sets of circuits are commonly used by the socket 2 corresponding to the flash memory card 3 and a control bus (Crt1. Bus), a data bus, and an address bus (Add. bus) corresponding to the flash memory 5. Also, it is reachable that the stored object can be shifted by way of an application circuit for memory shifts. The principle of designing the application circuit for memory shifts is stated hereinafter. In case of the flash memory card 3 being prior to inserting into the socket 2, a pin-s in the socket 2 has a logic position "1" so that the control end of the semiconductor switch 4 connecting with the socket 2 has a logic position "1" too. The logic position "1" means the semiconductor switch 4 is in a state of "ON" and pins "CE-C", "WP-C", "CD-C" in the micro controller 1 and pins "CE-F", "WP-F", "CD-F" in the flash memory 5 form a closed circuit respectively. Thus, the micro controller 1 can read the data in the memory 5 or write the data into the memory 5.

In case of the flash memory card 3 being inserted into the socket 2, the pin-s in the socket 2 connects with a ground pad (Gnd) in the flash memory card 3 and the logic position "1" is changed to logic position "0" so that the control end of the semiconductor switch 4 has a logic position "0" too. The logic position "0" means the semiconductor switch 4 is in a state of "OFF" and pins "CE-C", "WP-C", "CD-C" in the micro controller 1 and pins "CE-F", "WP-F", "CD-F" in the flash memory 5 form an open circuit respectively. Under this circumstance, pins "CE-C", "WP-C", "CD-C" in the micro controller 1 and pins "CE-S", "WP-S", "CD-S" in the flash memory card 3 form a closed circuit respectively instead while the flash memory card 3 has been inserted in the socket 2. Thus, the micro controller 1 can read the data in the flash memory card 5 or write the data into the flash memory card 5.

Comparing to other type of switch such as a mechanical switch, the semiconductor switch 4 adopted in the present invention can provides features such as an effect of zero delay, and low resistance in addition to a function of shifting "ON" or "OFF" based on different positions of the trigger voltage.

Figure 2:
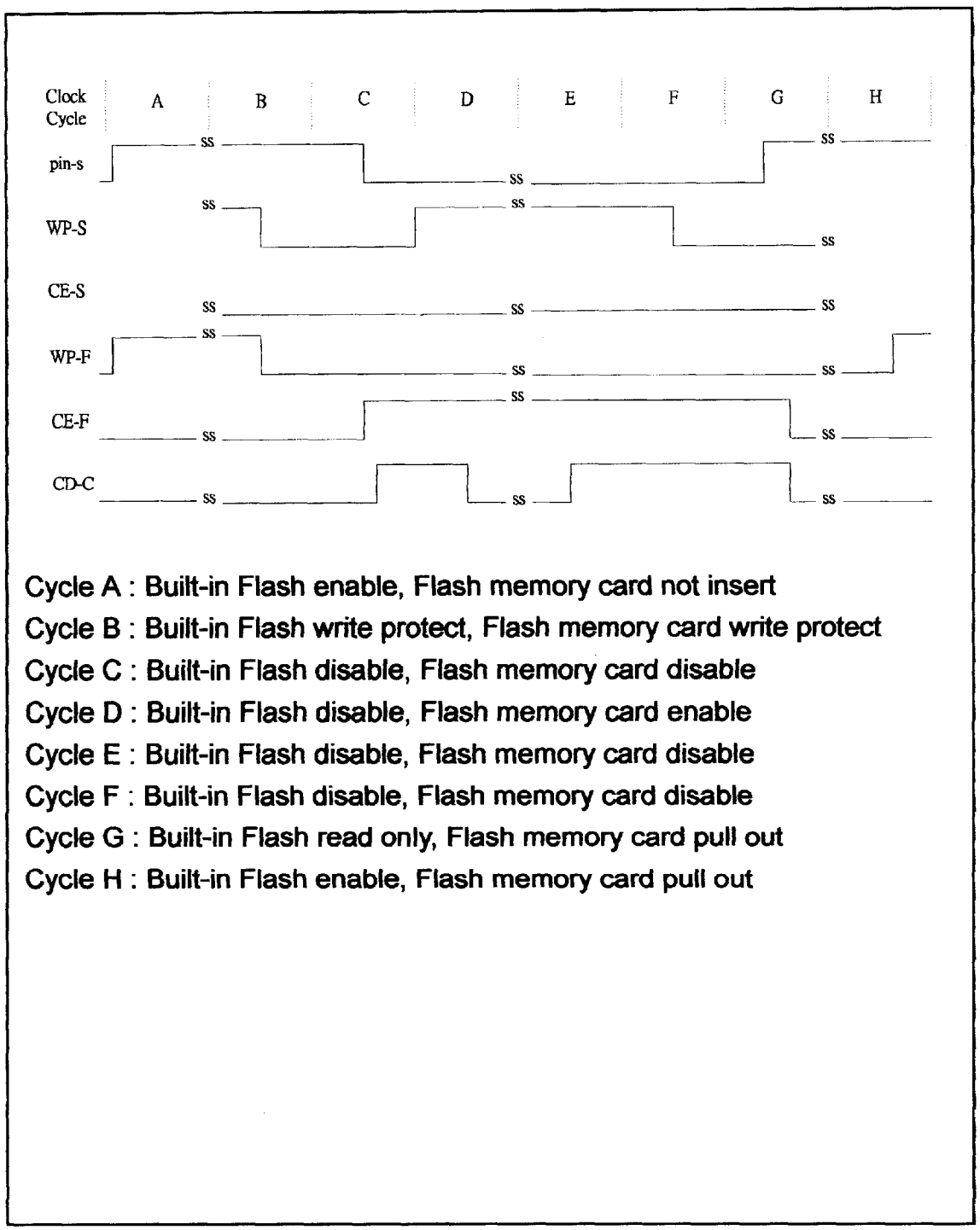
FIG. 2 is a time sequence diagram of application lines with regard to a shift memory in the present invention.

Next, referring to FIG. 2, a design of time pulse according to the present invention is illustrated.

In case of time pulse "A", the flash memory card 3 has not been inserted into the socket 2 yet and only the built-in flash memory 5 is available with WP-F=high, CE-F=low, and CD-C=low so that the built-in flash memory 5 can be read out and written in.

In case of time pulse "B", the flash memory card 3 has been inserting into the socket 2 and WP-S and WP-F are changed to be low so that the built-in flash memory 5 and the flash memory card 3 are in a state of write protection respectively.

In case of time pulse "C", the pin-s in the socket 2 connects with the ground pad (Gnd) and pin-s is changed to be low such that the semiconductor switch 4 becomes in a state of "OFF" to result in CE-F, WP-F, CD-F in the flash memory 5 disconnect from the micro controller 1 under a condition of CD-C=high. Thus, the built-in flash memory 5 and the flash memory card 3 are not possible to be read out and written in respectively.

In case of time pulse "D", the flash memory card 3 has been inserted into the socket 2 completely and has touched a card detect pin at the inner end thereof to result in CD-C=low so that the flash memory card 3 can be readout and written in, but the built-in flash memory 5 is still unable to be read out and written in.

In case of time pulse "E", the flash memory card 3 has been taken out from the socket 2 and detaches the card detect pin first to result in CD-C=high so that the flash memory card 3 and the built-in flash memory 5 are not possible to be read out and written in respectively.

In case of time pulse "F", WP-S changes to be low and the rest of the signals are unchanged.

In case of time pulse "G", the pin-s of the socket 2 detaches the ground pad (Gnd) of the flash memory card 3 and the pin-s becomes high to result in the semiconductor switch 4 in a state of "ON" so that CE-F, WP-F, CD-F in the flash memory 5 connect with the micro controller 1 again with CD-C=low. Thus, the built-in flash memory 5 is in a state of being read only.

In case of time pulse "H", WP-F becomes high and the built-in flash memory 5 can be read out and written in.

Figure 3:
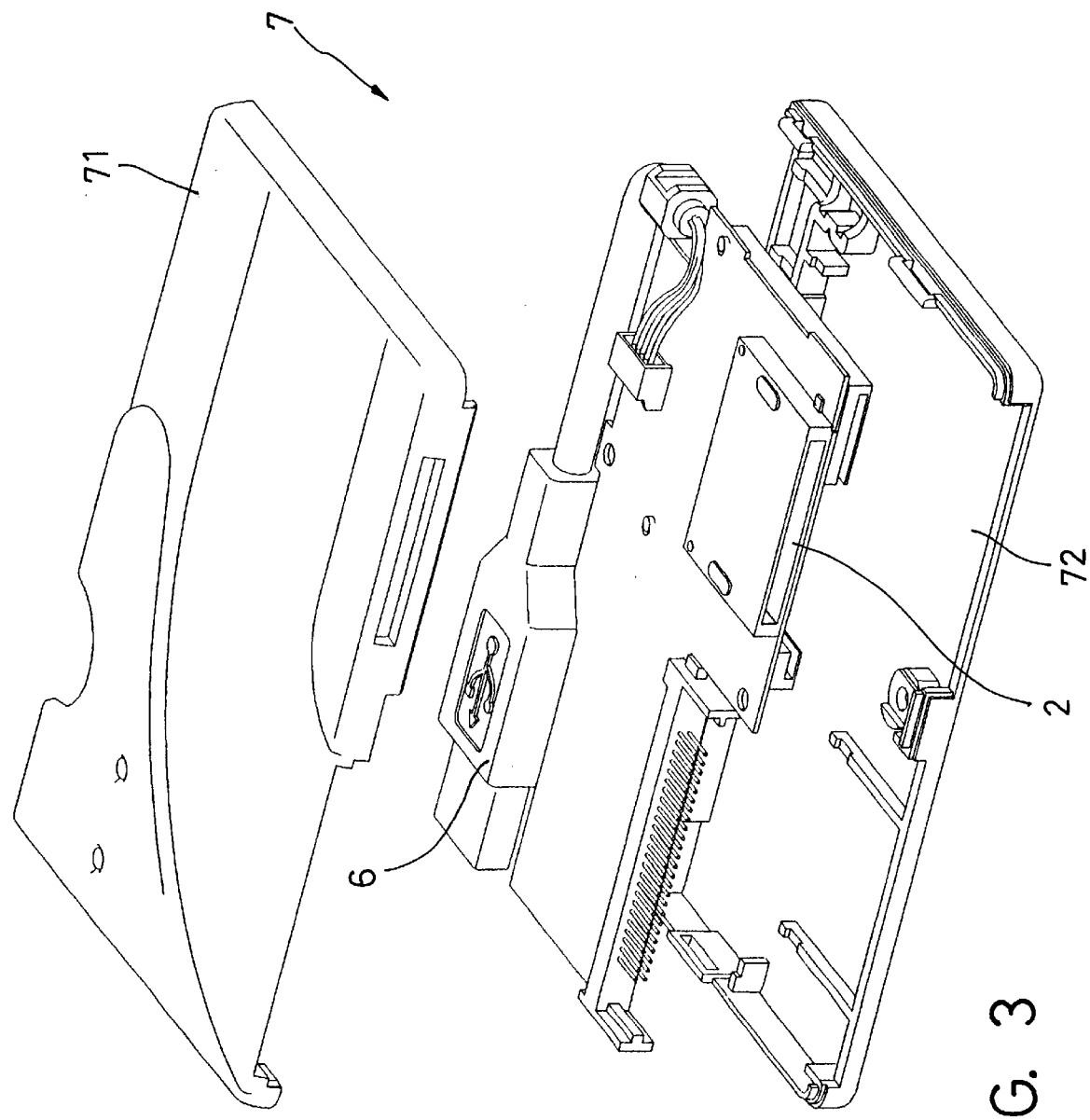
FIG. 3 is an exploded perspective view of the present invention.

Referring to FIG. 3, a perspective view of hardware of the present invention is illustrated. It can be seen that the flash memory card reader with USB interface according to the present invention comprises a casing 7 with an upper cover 71 and a lower cove 72, a USB terminal 6 between the upper and the lower casings 71, 72, a flash memory card 3 inserted into a socket 2, and a print circuit board.

It is appreciated from the preceding description that that the flash memory card reader with USB interface disclosed in the present invention offering a design of built-in flash memory has improved the function of conventional flash memory card reader greatly to provide a novel product with usefulness and creativity sufficiently.

While the invention has been described with reference to preferred embodiments thereof, it is to be understood that modifications or variations may be easily made without departing from the spirit of this invention, which is defined in the appended claims.

What is claimed is:

1. A USB interface flash memory card reader with built-in flash memory, comprising a casing, being composed of an upper cover and a lower cover joining to each other, and providing an inner space;

a printed circuit board, being disposed in the casing, providing a micro controller for decoding orders of a main unit such as data read, data write, and data delete;

a USB terminal, being disposed outside the casing, and connecting with the printed circuit board by way of a wire;

a socket, being disposed outside the casing, connecting with the printed circuit board by way of a circuit, and having a slot being detachably inserted by a flash memory;

a flash memory, being disposed on the printed circuit board;

a semiconductor switch, being disposed on the printed circuit board, being able to shift to a state of "ON" or "OFF" based on different trigger voltage positions so as to result in the built in flash memory connecting with or disconnecting from the micro controller; and an application circuit for memory shift, triggering the semiconductor switch in accordance with the flash memory card inserting into or taking out from the socket to shift to the built-in flash memory or to the flash memory card automatically.

2. The USB interface flash memory card reader with built-in flash memory according to claim 1, wherein the built-in flash memory is substitute memory for saving external data in case of the flash memory card being not inserted into the socket.

3. The USB interface flash memory card reader with built-in flash memory according to claim 1, wherein the application circuit for memory shift judges whether the flash memory card is inserted into the socket or not by way of a trigger position of a ground signal.

4. The USB interface flash memory card reader with built-in flash memory according to claim 1, wherein the semiconductor switch is a shifting switch and provides a function of shifting to a state of "ON" or "OFF" in accordance with the trigger voltage position.

* * * * *